US008295968B2

(12) United States Patent
Okuno

(10) Patent No.: US 8,295,968 B2
(45) Date of Patent: Oct. 23, 2012

(54) SETUP METHOD OF SUBSTRATE PROCESSING APPARATUS

(75) Inventor: Masanori Okuno, Toyama (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 391 days.

(21) Appl. No.: 12/563,205

(22) Filed: Sep. 21, 2009

(65) Prior Publication Data

US 2010/0080671 A1 Apr. 1, 2010

(30) Foreign Application Priority Data

Sep. 26, 2008 (JP) ................................ 2008-248798
Aug. 21, 2009 (JP) ................................ 2009-192373

(51) Int. Cl.
*G06F 19/00* (2006.01)
(52) U.S. Cl. ....................... 700/121; 700/112
(58) Field of Classification Search .................. 700/121; 438/14
See application file for complete search history.

(56) References Cited

U.S. PATENT DOCUMENTS

| | | | | |
|---|---|---|---|---|
| 5,949,682 A * | 9/1999 | Dickinson et al. | ............ | 700/121 |
| 6,078,944 A * | 6/2000 | Enko et al. | ..................... | 718/105 |
| 6,204,679 B1 * | 3/2001 | Gray, III | .................. | 324/750.14 |
| 6,351,134 B2 * | 2/2002 | Leas et al. | ................ | 324/750.05 |
| 7,838,790 B2 * | 11/2010 | Kang et al. | ..................... | 209/573 |

* cited by examiner

*Primary Examiner* — Ryan Jarrett
(74) *Attorney, Agent, or Firm* — Brundidge & Stanger, P.C.

(57) ABSTRACT

A setup method of a substrate processing apparatus includes: connecting a test terminal, which includes a pseudo comprehensive control unit and a second operation unit, to a plurality of process chamber control units, with the process chamber control units being separated from the comprehensive control unit and a first operation unit; transmitting a process chamber test operation command from the second operation unit to the plurality of process chamber control units through the pseudo comprehensive control unit; testing operations of a plurality of process chambers in parallel by the plurality of process chamber control units receiving the process chamber test operation command; and transmitting a process chamber test operation report from the plurality of process chamber control units to the second operation unit through the pseudo comprehensive control unit.

14 Claims, 12 Drawing Sheets

Fig. 12

| SITE | ITEM OF OPERATION | SCHEDULE OF OPERATION (DAY) | | | | | | | | | | | | | | | | | | | |
|---|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 | 19 | 20 |
| DEVICE | | ▓ | ▓ | ▓ | | | | | | | | | | | | | | | | | | |
| PM1 | VALVE I/O CHECK | | | | ▓ | | | | | | | | | | | | | | | | | |
| | INTERLOCK CHECK | | | | | ▓ | | | | | | | | | | | | | | | | |
| | CHAMBER VACUUM CHECK | | | | | | ▓ | | | | | | | | | | | | | | | |
| PM2 | VALVE I/O CHECK | | | | | | | ▓ | | | | | | | | | | | | | | |
| | INTERLOCK CHECK | | | | | | | | ▓ | | | | | | | | | | | | | |
| | CHAMBER VACUUM CHECK | | | | | | | | | ▓ | | | | | | | | | | | | |
| PF | CARRYING SYSTEM CHECK | | | | | | | | | | ▓ | ▓ | ▓ | | | | | | | | | |
| | VALVE CHECK | | | | | | | | | | | | | ▓ | | | | | | | | |
| | INTERLOCK CHECK | | | | | | | | | | | | | | | ▓ | | | | | | |
| | CHAMBER VACUUM CHECK | | | | | | | | | | | | | | | | | ▓ | | | | |
| | OVERALL CARRYING CHECK | | | | | | | | | | | | | | | | | | ▓ | ▓ | ▓ | |

Fig. 13

| SITE | ITEM OF OPERATION | SCHEDULE OF OPERATION (DAY) | | | | | | | | | | | | | | | | | | | |
|---|---|---|---|---|---|---|---|---|---|---|---|---|---|---|---|---|---|---|---|---|---|
| | | 1 | 2 | 3 | 4 | 5 | 6 | 7 | 8 | 9 | 10 | 11 | 12 | 13 | 14 | 15 | 16 | 17 | 18 | 19 | 20 |
| DEVICE | | ▓ | ▓ | ▓ | | | | | | | | | | | | | | | | | | |
| PM1 | VALVE I/O CHECK | | | | ▓ | | | | | | | | | | | | | | | | | |
| | INTERLOCK CHECK | | | | | ▓ | | | | | | | | | | | | | | | | |
| | CHAMBER VACUUM CHECK | | | | | | ▓ | | | | | | | | | | | | | | | |
| PM2 | VALVE I/O CHECK | | | | ▓ | | | | | | | | | | | | | | | | | |
| | INTERLOCK CHECK | | | | | ▓ | | | | | | | | | | | | | | | | |
| | CHAMBER VACUUM CHECK | | | | | | ▓ | | | | | | | | | | | | | | | |
| PF | CARRYING SYSTEM CHECK | | | | | | | ▓ | ▓ | ▓ | | | | | | | | | | | | |
| | VALVE CHECK | | | | ▓ | | | | | | | | | | | | | | | | | |
| | INTERLOCK CHECK | | | | | ▓ | | | | | | | | | | | | | | | | |
| | CHAMBER VACUUM CHECK | | | | | | ▓ | | | | | | | | | | | | | | | |
| | OVERALL CARRYING CHECK | | | | | | | | | | | | ▓ | ▓ | ▓ | | | | | | | |

SETUP METHOD OF SUBSTRATE PROCESSING APPARATUS

CROSS-REFERENCE TO RELATED PATENT APPLICATION

This U.S. non-provisional patent application claims priority under 35 §119 of Japanese Patent Application Nos. 2008-248798, filed on Sep. 26, 2008, and 2009-192373, filed on Aug. 21, 2009, in the Japanese Patent Office, the entire contents of which are hereby incorporated by reference.

BACKGROUND OF THE INVENTION

1. Field of the Invention

The present invention relates to a substrate processing apparatus with a plurality of process furnaces, and in particular, to a preparatory work that is performed before starting an operation of a substrate processing apparatus.

2. Description of the Prior Art

A conventional substrate processing apparatus which performs a manufacturing process of a semiconductor device such as DRAM includes a plurality of process furnaces each including a process chamber which processes a substrate, a plurality of process furnace control units connected to the plurality of process furnaces to individually control operations of the plurality of process furnaces, a comprehensive control unit connected to the plurality of process furnace control units to comprehensively control the operations of the process furnaces through the plurality of process furnace control units, and an operation unit connected to the comprehensive control unit and the plurality of process furnace control units to transmit operation commands to the plurality of process furnace control units through the comprehensive control unit and, at the same time, to receive operation reports from the plurality of process furnace control units through the comprehensive control unit.

In order to start the operation of the substrate processing apparatus, the substrate processing apparatus is installed, electrical facilities are interconnected, and gas supply lines and exhaust lines are connected. Thereafter, various processes (hereinafter, collectively referred to as a setup process) such as I/O check (I/O operation check of various input/output valves provided in the substrate processing apparatus), interlock check (depressurization operation check of various chambers or depressurization chambers provided in the substrate processing apparatus), and robot teaching (carrying operation check of carrying mechanism provided in the substrate processing substrate) need to be performed at each process furnace.

To promptly start the operation of the substrate processing apparatus, it is preferable to reduce the total time necessary for the setup process by performing the setup process once concurrently at each process furnace.

However, even though the number of operators for the setup process increases, it is difficult to reduce the total time necessary for the setup process. In the setup process of the conventional substrate processing apparatus, such as I/O check, interlock check and robot teaching, the operators must transmit the operation command from the operation unit, and thus, it is difficult to perform the setup process once concurrently because the number (one) of the operation unit provided in the substrate processing apparatus is limited.

The reduction of the time necessary for the setup time may be achieved by installing a test program dedicated to the setup process into the process furnace control units and performing the setup process in parallel at the process furnace control units. However, since the actual program used after the start of the operation and the test program installed into the process furnace control units are different from each other, it is difficult to confirm whether problems arise when the actual program is executed, even though the setup process is performed in the above-described manner.

SUMMARY OF THE INVENTION

An object of the present invention is to provide a setup method of a substrate processing apparatus, which is capable of reducing time necessary for a setup process when starting to operate a substrate processing apparatus with a plurality of process furnaces.

According to an aspect of the present invention, there is provided a setup method of a substrate processing apparatus comprising: a plurality of process chambers configured to process substrates; a plurality of process chamber control units connected to the plurality of process chambers to individually control operations of the plurality of process chambers; a comprehensive control unit configured to be connectable to the plurality of process chamber control units to comprehensively control the operations of the plurality of process chambers through the plurality of process chamber control units; and a first operation unit configured to be connectable to the comprehensive control unit and the plurality of process chamber control units to transmit an operation command to the plurality of process chamber control units through the comprehensive control unit and to receive an operation report from the plurality of process chamber control units through the comprehensive control unit, the setup method comprising a process chamber test process comprising: connecting a test terminal, including a pseudo comprehensive control unit and a second operation unit to the plurality of process chamber control units with the plurality of process chamber control units being separated from the comprehensive control unit and the first operation unit; transmitting a process chamber test operation command from the second operation unit to the plurality of process chamber control units through the pseudo comprehensive control unit; testing the operations of the plurality of process chambers in parallel by the plurality of process chamber control units receiving the process chamber test operation command; and transmitting process chamber test operation reports from the plurality of process chamber control units to the second operation unit through the pseudo comprehensive control unit.

According to another aspect of the present invention, there is provided a setup method of a substrate processing apparatus, comprising: a process furnace test process which performs a normality check of a carrying chamber and a process chamber; and a carrying test process which carries a substrate into the carrying chamber and the process chamber, wherein the normality check of the carrying chamber and the normality check of the process chamber are performed in parallel.

According to another aspect of the present invention, there is provided a setup method of a substrate processing apparatus, comprising: an I/O check process which performs an operation check of various input/output valves provided in the substrate processing apparatus; an interlock check process which performs a depressurization operation check of various interiors provided in the substrate processing apparatus; and a robot teaching process which performs a carrying operation check of the carrying mechanism provided in the substrate processing apparatus.

BRIEF DESCRIPTION OF THE DRAWINGS

FIG. 12 is a table diagram showing an example of an operation schedule of a conventional setup process.

FIG. 13 is a table diagram showing an example of an operation schedule of a setup process in accordance with an embodiment of the present invention.

DETAILED DESCRIPTION OF THE PREFERRED EMBODIMENTS

<Exemplary Embodiment of the Present Invention>

Hereinafter, the configuration and operation of a substrate processing apparatus in accordance with an embodiment of the present invention will be described.

(1) Configuration of Substrate Processing Apparatus

Figure 1:
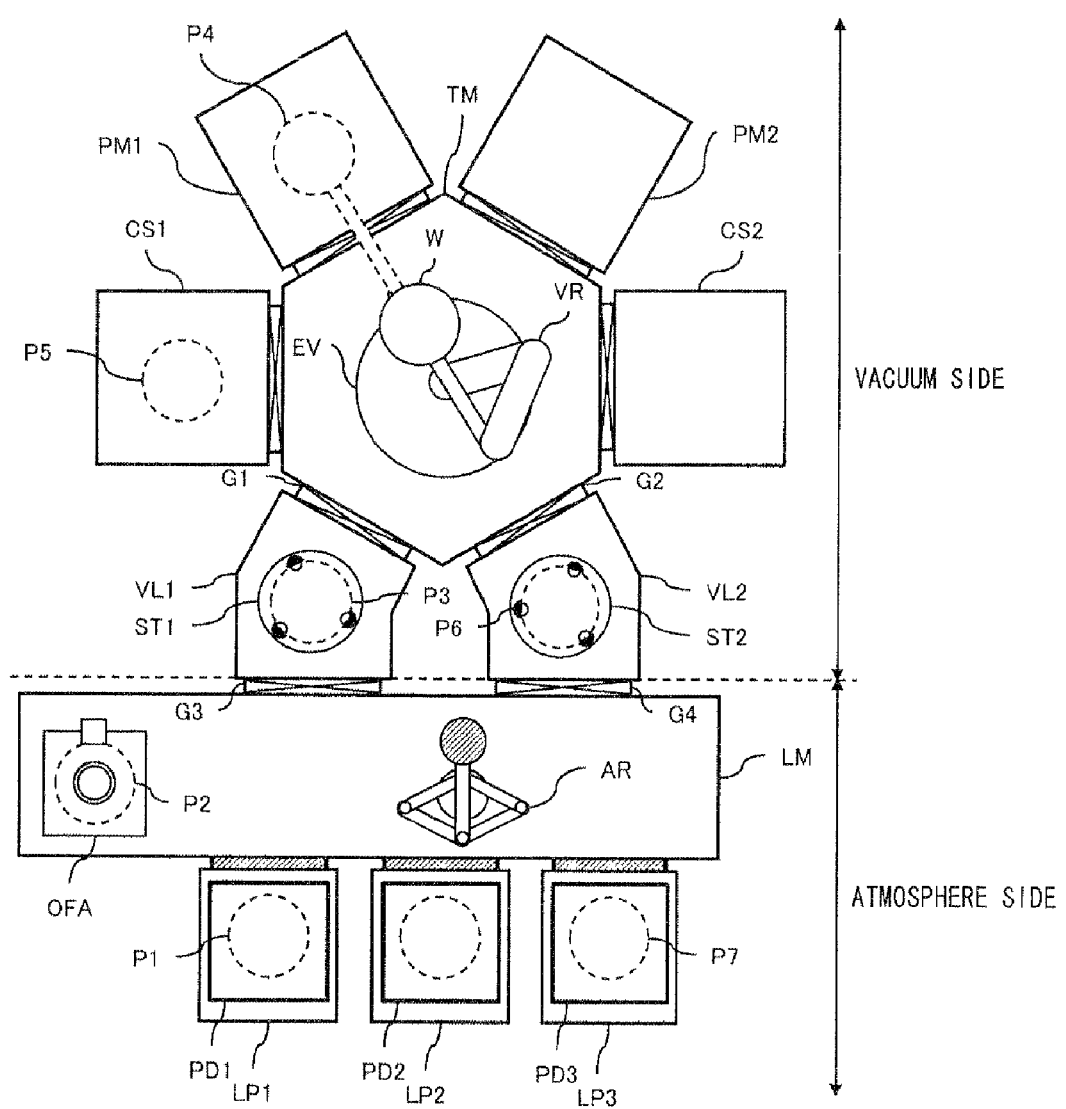
FIG. 1 is a schematic configuration diagram of a cluster type substrate processing apparatus in accordance with an embodiment of the present invention.
Figure 3:
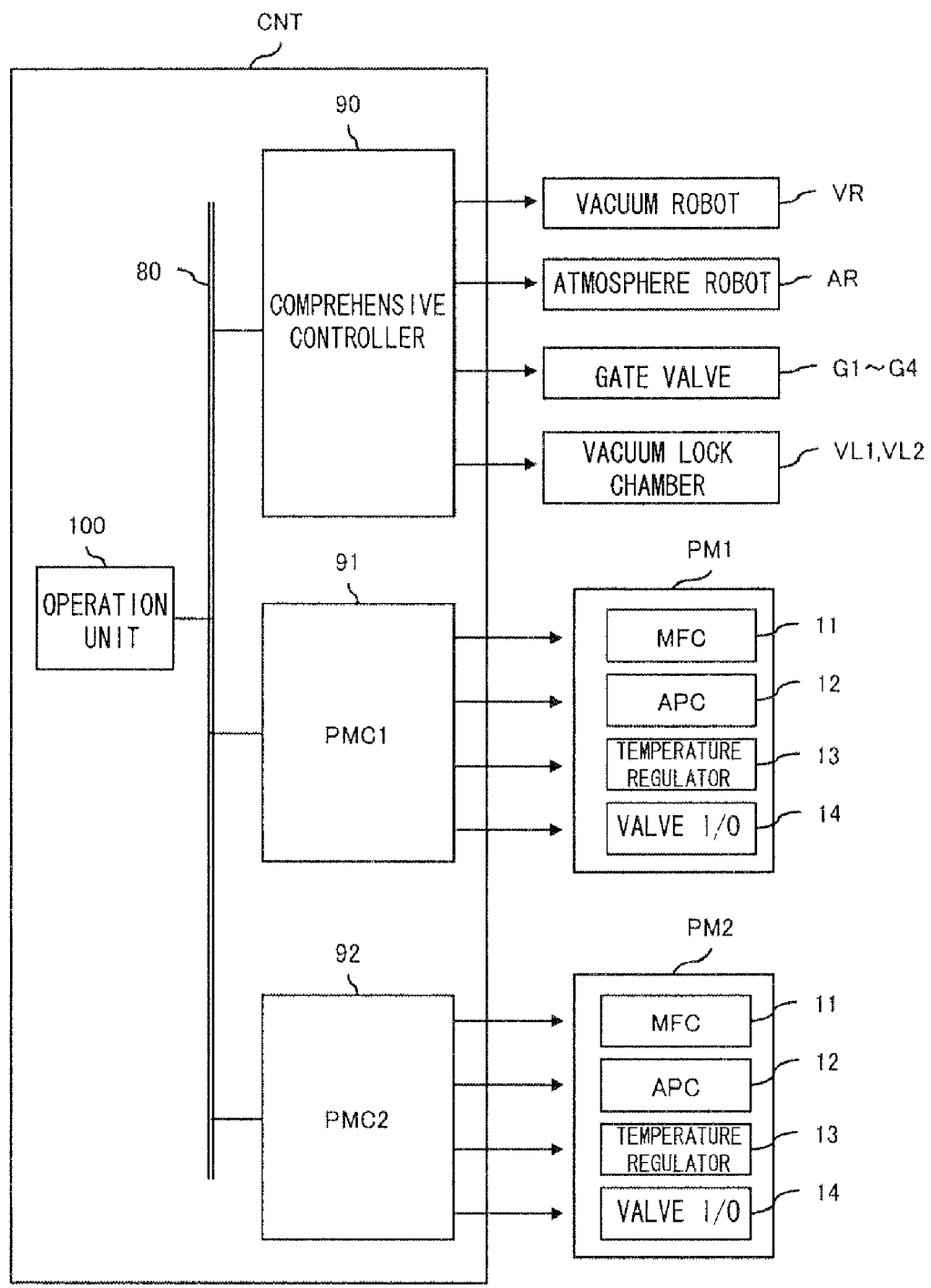
FIG. 3 is a block diagram illustrating the configuration of a control unit in the substrate processing apparatus in accordance with an embodiment of the present invention.

First, the configuration of a substrate processing apparatus in accordance with an embodiment of the present invention will be described below with reference to FIG. 1 and FIG. 3. FIG. 1 is a schematic configuration diagram of a cluster type substrate processing apparatus in accordance with an embodiment of the present invention. FIG. 3 is a block diagram illustrating the configuration of a control unit in the substrate processing apparatus in accordance with an embodiment of the present invention. The cluster type substrate processing apparatus in accordance with the current embodiment of the present invention is divided into a vacuum side and an atmosphere side.

(Configuration of Vacuum Side)

On the vacuum side of the cluster type substrate processing apparatus, a vacuum-tight sealable vacuum carrying chamber (transfer chamber) TM, vacuum lock chambers (load lock chambers) VL1 and VL2 as preliminary chambers, process chambers PM1 and PM2 as process furnaces each having a process chamber which processes a substrate such as a wafer W, and cooling chambers CS1 and CS2 which cools the wafer W are installed. The vacuum lock chambers VL1 and VL2, the process chambers PM1 and PM2, and the cooling chambers CS1 and CS2 are disposed around the periphery of the vacuum carrying chamber TM in a star-shaped form (cluster-shaped form).

The vacuum carrying chamber TM is configured in a load lock chamber structure which can withstand a pressure (negative pressure) such as a vacuum state lower than atmospheric pressure. Also, in accordance with the embodiment of the present invention, a housing of the vacuum carrying chamber TM has a hexagonal shape in a plan view, and the top and bottom ends of the housing are formed in a closed box shape.

The inside of the vacuum carrying chamber TM is provided with a vacuum robot VR as a vacuum carrying mechanism. The vacuum robot VR mutually carries the wafer W to an arm used as a substrate loading section among the vacuum lock chambers VL1 and VL2, the process chambers PM1 and PM2 and the cooling chamber CS1 and CS2. In addition, the vacuum robot VR is configured to be movable upward and downward with an elevator EV while the airtightness of the vacuum carrying chamber TM is maintained. Furthermore, at certain positions (near gate valves) in front of the vacuum lock chambers VL1 and VL2, the process chambers PM1 and PM2 and the cooling chambers CS1 and CS2, wafer existence/nonexistence sensors are fixed as substrate detection units which detect existence/nonexistence of the wafer W.

The process chambers PM1 and PM2 are configured to give an added value to the wafer W, for example, by performing a process of forming a thin film on the wafer W by a Chemical Vapor Deposition (CVD) method or a Physical Vapor Deposition (PVD) method, a process of forming an oxide film or a nitride film on the surface of the wafer W, or a process of forming a metal thin film on the wafer W. In addition to a gas introduction/exhaust mechanism (not shown) and a plasma discharge mechanism (not shown), the process chambers PM1 and PM2 are provided with mass flow controllers (MFC) 11 which control a flow rate of a process gas supplied into the process chambers PM1 and PM2 illustrated in FIG. 3, automatic pressure controllers (APC) 12 which control inside pressure inside the process chambers PM1 and PM2, temperature regulators 13 which control temperature inside the process chambers PM1 and PM2, and input/output valve I/Os 14 which control on/off of a process gas supply or exhaust valve. While exhausting the insides of the process chambers PM1 and PM2 by the gas exhaust mechanism and supplying the process gas into the process chambers PM1 and PM2 by the gas introduction mechanism, high-frequency power is supplied to the process chambers PM1 and PM2 to generate plasma inside the process chambers PM1 and PM2, and the surface of the wafer W is processed.

The vacuum lock chambers VL1 and VL2 are used as preliminary chambers which load the wafer W into the vacuum carrying chamber TM, or as preliminary chambers which unload the wafer W from the vacuum carrying chamber TM. At the insides of the vacuum lock chambers VL1 and VL2, buffer stages ST1 and ST2 are respectively fixed to temporarily support the wafer W for the loading and unloading of the substrate.

The vacuum lock chambers VL1 and VL2 are designed to communicate with the vacuum carrying chamber TM through gate valves G1 and G2, respectively, and also designed to communicate with an atmosphere carrying chamber LM (which will be described later) through gate valves G3 and G4, respectively. Accordingly, by opening the gate valves G3 and G4 with the gate valves G1 and G2 closed, the wafer W can be carried between the vacuum lock chambers VL1 and VL2 and the atmosphere carrying chamber LM while the inside of the vacuum carrying chamber TM is kept in a vacuum-tight state.

Moreover, the vacuum lock chambers VL1 and VL2 are configured in a load lock chamber structure which can withstand a negative pressure such as a vacuum state lower than atmospheric pressure, and configured so that their insides can be vacuum-exhausted. Accordingly, by closing the gate valves G3 and G4 to vacuum-exhaust the insides of the vacuum lock chambers VL1 and VL2 and then opening the gate valves G1 and G2, the wafer W can be carried between the vacuum lock chambers VL1 and VL2 and the vacuum carrying chamber TM while the inside of the vacuum carrying chamber TM is kept in a vacuum state.

The cooling chambers CS1 and CS2 function to accommodate and cool the wafer W. The cooling chamber CS1 and CS2 are also configured so that their insides can be vacuum-exhausted. Also, gate valves are also fixed between the cooling chambers CS1 and CS2 and the vacuum carrying chamber TM, respectively.

(Configuration of Atmosphere Side)

On the other hand, on the atmosphere side of the cluster type substrate processing apparatus, the atmosphere carrying chamber LM as an atmosphere carrying chamber connected to the vacuum lock chambers VL1 and VL2, and load ports LP1 to LP3 as a substrate holding unit connected to the atmosphere carrying chamber LM are installed. Pods PD1 to PD3 as substrate holding containers are provided on the load ports LP1 to LP3. At the insides of the pods PD1 to PD3, a plurality of slots are provided as holding units which accommodate the wafers W.

The atmosphere carrying chamber LM is provided with a clean air unit (not shown) which supplies clean air into the inside of the atmosphere carrying chamber LM.

The atmosphere carrying chamber LM is provided with one atmosphere robot AR as an atmosphere carrying mechanism. The atmosphere robot AR mutually carries the substrate such as the wafer W between the vacuum lock chambers VL1 and VL2 and the pods PD1 to PD3 loaded on the load ports LP1 to LP3. Like the vacuum robot VR, the atmosphere robot AR also has an arm used as a substrate holding unit. Moreover, at a certain position (near the gate valve) in front of the atmosphere carrying chamber LM, a wafer existence/nonexistence sensor (not shown) is fixed as a substrate detection unit which detects existence/nonexistence of the wafer W.

In addition, the atmosphere carrying chamber LM is provided with an orientation flat aligning device OFA which performs the positioning of crystal orientation in the wafer W as a substrate position correcting device.

(Configuration of Control Unit)

Each component section of the cluster type substrate processing apparatus is controlled by a control unit CNT. A configuration example of the control unit CNT is illustrated in FIG. 3. The control unit CNT includes a comprehensive controller (CC) 90 as a comprehensive control unit, a process module controller (PMC 1) 91 as a process furnace control unit, a process module controller (PMC2) 92 as a process furnace control unit, and a first operation unit (OU) 100 operated by an operator.

The process module controllers (PMC1, PMC2) 91 and 92 are connected to the process chambers PM1 and PM2 and designed to individually control the operations of the process chambers PM1 and PM2, respectively. Specifically, the process module controllers 91 and 92 are connected to the MFCs 11, the APCs 12, the temperature regulators 13, the input/output valve I/Os 14 and the like provided at the process chambers PM1 and PM2, respectively. The process module controllers 91 and 92 are designed to control each operation of the gas introduction/exhaust mechanism to/from the process chambers PM1 and PM2, the temperature control/plasma discharge mechanism, the cooling mechanism of the cooling chambers CS1 and CS2 and the like.

The comprehensive controller (CC) 90 is configured to be connectable to the process module controllers 91 and 92 through a LAN line 80 and designed to comprehensively control the operations of the process chambers PM1 and PM2 through the process module controllers 91 and 92. In addition, the comprehensive controller 90 is connected to the vacuum robot VR, the atmosphere robot AR, the gate valves G1 to G4, and the vacuum lock chambers VL1 and VL2, respectively. The comprehensive controller 90 is designed to control the operations of the vacuum robot VR and the atmosphere robot AR, the opening/closing operations of the gate valves G1 to G4, and the exhaust operations inside the vacuum lock chambers VL1 and VL2. Moreover, the comprehensive controller 90 is connected to the above-described wafer existence/nonexistence sensors (not shown) and designed to create position information indicating the position of the wafer W inside the substrate processing apparatus, based on detection signals from the wafer existence/nonexistence sensors, and to update the position information as needed. The comprehensive controller 90 is designed to control the operations of the vacuum robot VR and the atmosphere robot AR used as the carrying unit and the operations of the gate valves G1 to G4, based on a processing status of the wafer W, a wafer ID for identifying the wafer W, and data of a recipe performed on the wafer W, in addition to accommodating information that designates which slot among the pods PD1 to PD3 the wafer W will be accommodated in and the position information.

The first operation unit (OU) 100 is configured to be connectable to the comprehensive controller 90 and the process module controllers 91 and 92 through the LAN line 80, respectively. The first operation unit 100 is configured as a general-purpose computer which is provided with a CPU, a memory, a communication interface, and a hard disk. The hard disk of the first operation unit 100 stores a comprehensive system control program, a PM1 operation program, a PM2 operation program and the like. The comprehensive system control program is read from the hard disk of the first operation unit 100 to the memory and is executed by the CPU to enable the first operation unit 100 to execute the function of transmitting operation commands (messages) to the comprehensive controller 90 and the function of receiving operation reports (messages) from the comprehensive controller 90. Also, the PM1 operation program and the PM2 operation program are read from the hard disk of the first operation unit 100 to the memory and are executed by the CPU to enable the first operation unit 100 to execute the function of transmitting operation commands (messages) to the process module controllers 91 and 92 through the comprehensive controller 90 and the function of receiving operation reports (messages) from the process module controllers 91 and 92 through the comprehensive controller 90. Moreover, the first operation unit 100 is designed to manage screen display/input reception functions such as monitor display, logging data, alarm analyses, and parameter editions.

(2) Substrate Processing Process

Next, an example of the substrate processing process performed by the substrate processing apparatus in accordance with the embodiment of the present invention will be described with reference to FIG. 4 and FIG. 5.

Figure 4:
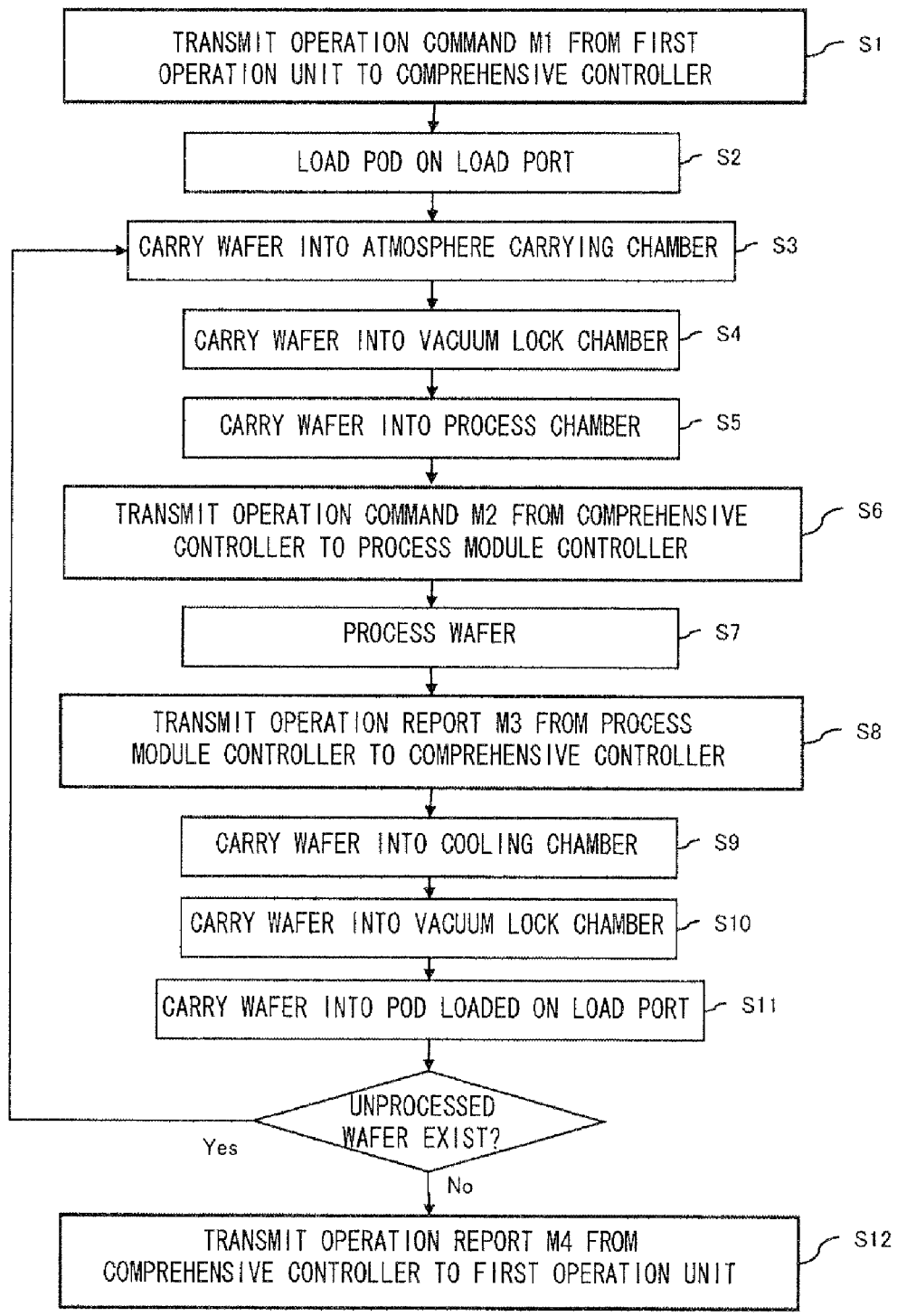
FIG. 4 is a flowchart of a substrate processing process which is performed by the substrate processing apparatus in accordance with an embodiment of the present invention.
Figure 5:
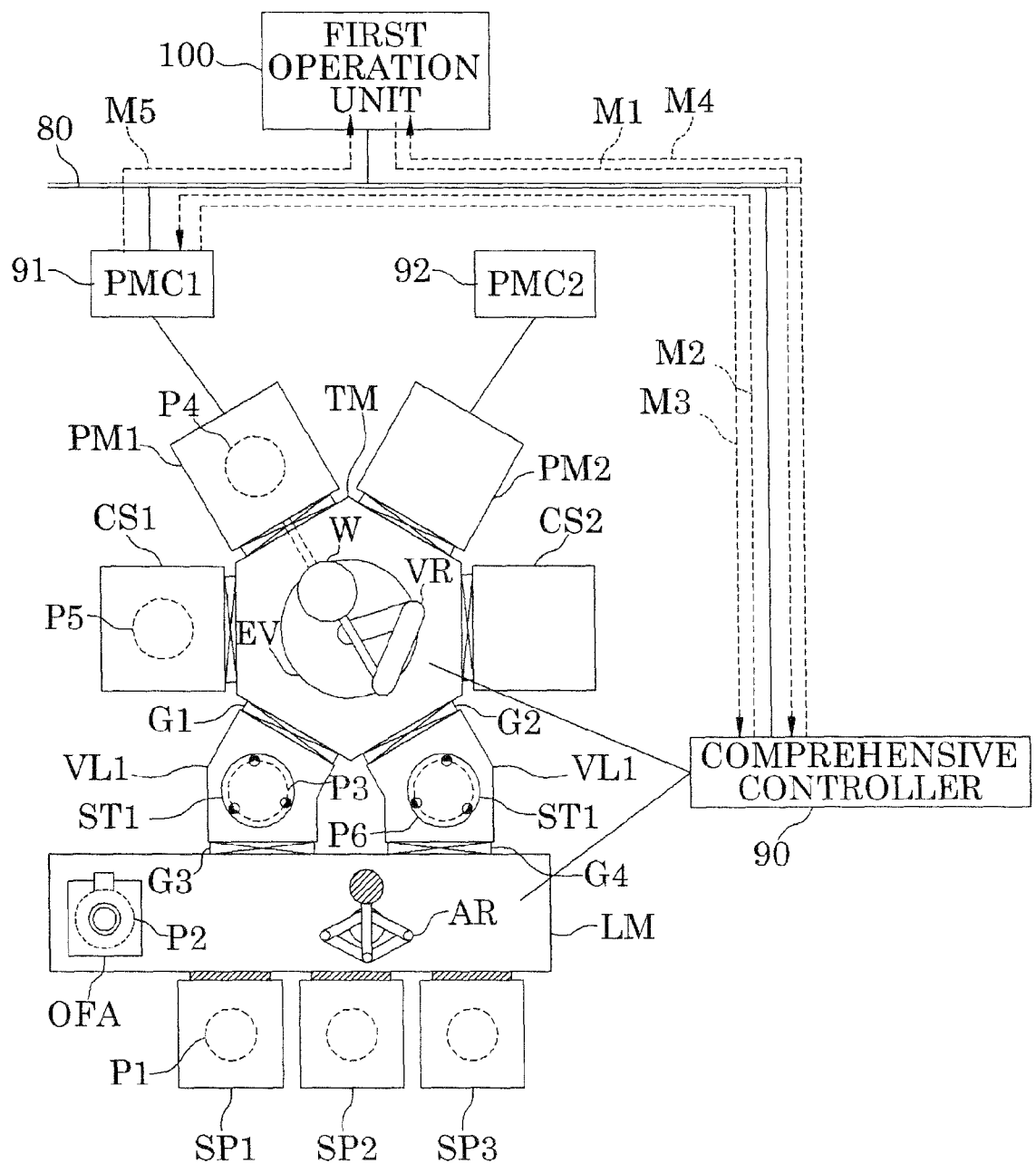
FIG. 5 is a schematic diagram illustrating an exemplary operation of the control unit in the substrate processing process in accordance with the embodiment of the present invention.

FIG. 4 is a flowchart of a substrate processing process which is performed by the substrate processing apparatus in accordance with an embodiment of the present invention. FIG. 5 is a schematic diagram illustrating an exemplary operation of the control unit in the substrate processing process in accordance with the embodiment of the present invention. In addition, dashed lines indicate transmission and reception of messages within the substrate processing apparatus.

As illustrated in FIG. 4, an operation command M1 instructing to start a substrate processing is transmitted from the first operation unit 100 to the comprehensive controller 90 (S1).

The comprehensive controller 90 receiving the operation command M1 vacuum-exhausts the insides of the vacuum carrying chamber TM, the process chambers PM1 and PM2, and the cooling chambers CS1 and CS2 by closing the gate valves G1 and G4 and opening the gate valves G2 and G3. The comprehensive controller 90 supplies clean air into the atmosphere carrying chamber LM to get the atmosphere carrying chamber LM to almost the atmospheric pressure. Then, the pod PD1 where a plurality of unprocessed wafers W are held is loaded on the load port LP1 (S2).

Subsequently, the comprehensive controller 90 controls the atmosphere robot AR to carry the wafer W, which is held at a substrate position P1 inside the pod PD1 loaded on the load port LP1, into the atmosphere carrying chamber LM, to place the wafer W at a substrate position P2 on the orientation flat aligning device OFA, and to perform the positioning of crystal orientation (S3).

Subsequently, the comprehensive controller 90 controls the atmosphere robot AR to pick up the wafer W placed at the substrate position P2, to carry the wafer W into the vacuum lock chamber VL1, and to place the wafer W at a substrate position P3 on the buffer stage ST1. Then, the comprehensive controller 90 closes the gate valve G3 to vacuum-exhaust the inside of the vacuum lock chamber VL1 (S4).

When the vacuum lock chamber VL1 is depressurized up to a predetermined pressure, the comprehensive controller 90 opens the gate valve G1, with the gate valve G3 closed. Then, the comprehensive controller 90 controls the vacuum robot VR to pick up the wafer W placed at the substrate position P3, to carry the wafer W into the process chamber PM1, and to place the wafer W at a substrate position P4 (S5).

When the wafer W is carried in the inside of the process chamber PM1, the comprehensive controller 90 transmits an operation command M2 instructing to start a process of a substrate processing recipe through the LAN 80 to the process module controller 91 (S6).

The process module controller 91 performs a predetermined process (film forming process and the like) on the wafer W by supplying a process gas into the process chamber PM1 (S7).

When the processing on the wafer W is completed, the process module controller 91 transmits an operation report M3 indicating the completion of the processing on the wafer W through the LAN 80 to the comprehensive controller 90 (S8).

The comprehensive controller 90 receiving the operation report M3 controls the vacuum robot VR to pick up the processed wafer W placed at the substrate position P4, to carry the processed wafer W into the cooling chamber CS1, and to place the process wafer W at a substrate position P5 (S9).

When the cooling processing inside the cooling chamber CS1 is completed, the comprehensive controller 90 controls the vacuum robot VR to pick up the processed wafer W placed at the substrate position P5, to carry the processed wafer W into the vacuum lock chamber VL2, and to place the processed wafer W at a substrate position P6 on the buffer stage ST2. Then, the comprehensive controller 90 closes the gate valve G2, supplies clean air into the vacuum lock chamber VL2 to get the vacuum lock chamber VL2 back to almost the atmospheric pressure, and opens the gate valve G4 (S10).

Subsequently, the comprehensive controller 90 controls the atmosphere robot AR to pick up the processed wafer W placed at the substrate position P2, to carry the processed wafer W into the pod PD3 loaded on the load port LP3, and to hold the processed wafer W into a vacant slot (S11).

After the above-described processes are repeated to perform automatic carrying processing on all unprocessed wafers W, the comprehensive controller 90 unloads the pod PD3 accommodating the processed wafers W from the load port LP3. Then, the comprehensive controller 90 transmits an operation report M4 indicating the completion of the substrate processing instructed by the operator through the LAN 80 to the first operation unit 100, and finishes the substrate processing (S12).

In addition, in the above-described processes S1 to S12, monitor data or alarm (message M5) sent from the process module controllers 91 and 92 is directly transmitted to the first operation unit 100 without passing through the comprehensive controller 90.

(3) Setup Process

Next, a setup process to be performed upon the operation of the above-described substrate processing apparatus will be described below. The setup process in accordance with the current embodiment includes a process test process and a carrying test process.

(Process Furnace Test Process)

Figure 11:
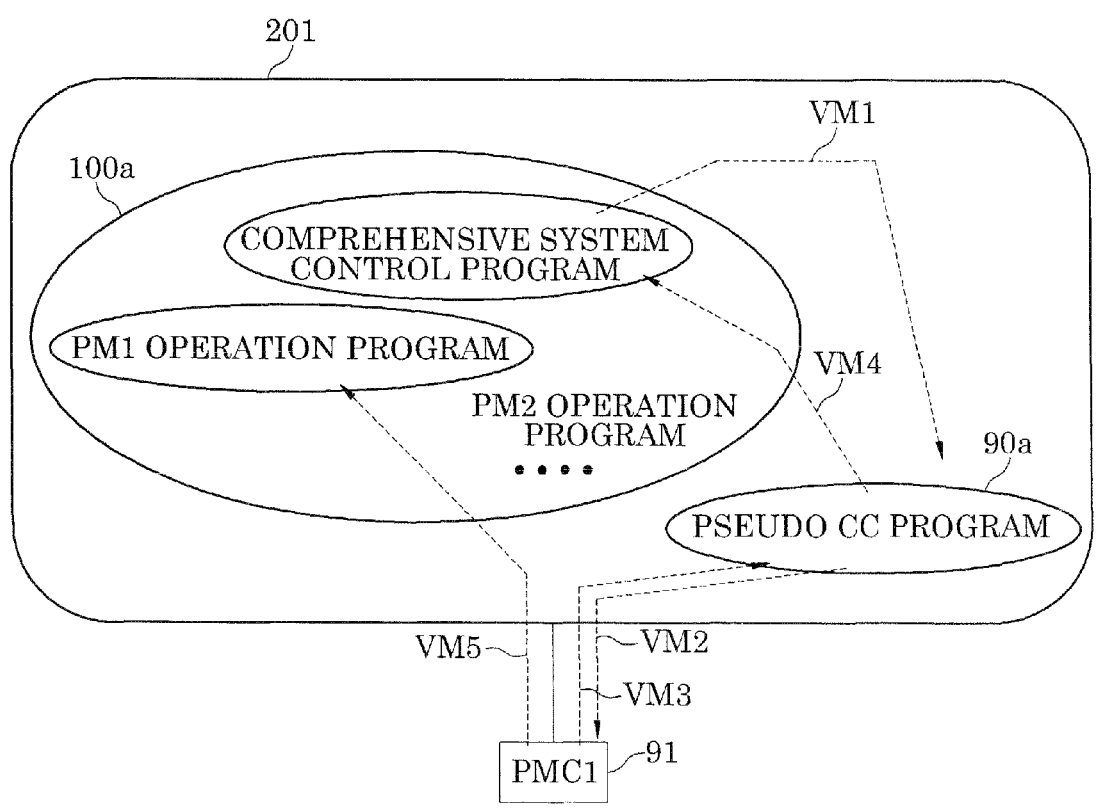
FIG. 11 is a schematic diagram illustrating an exemplary configuration of a program for a test terminal in accordance with an embodiment of the present invention.

First, a process furnace test process will be described with reference to FIG. 6, FIG. 7 and FIG. 11.

Figure 6:
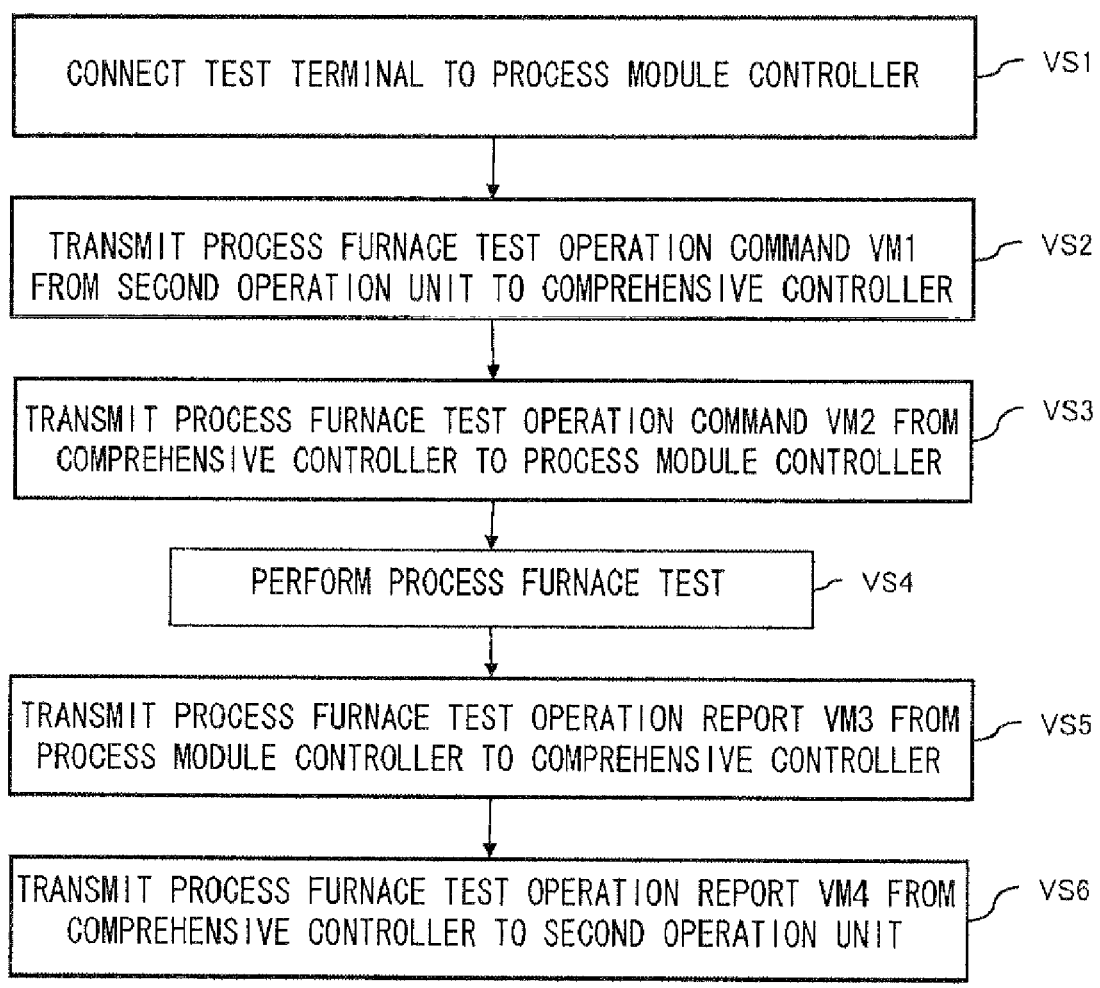
FIG. 6 is a flowchart of a process furnace test process which is performed in the substrate processing apparatus in accordance with an embodiment of the present invention.
Figure 7:
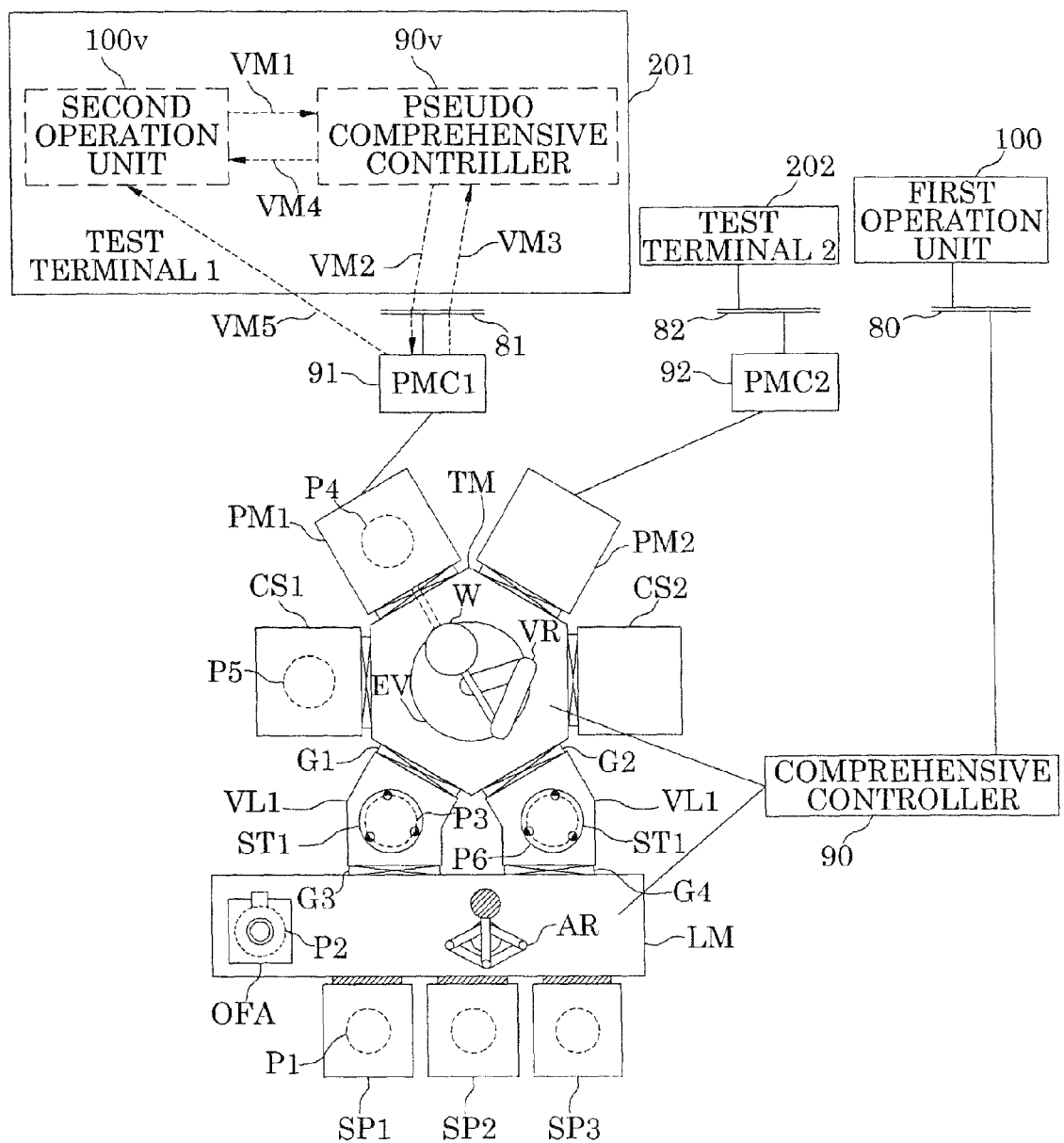
FIG. 7 is a schematic diagram illustrating an exemplary operation of the control unit in the process furnace test process in accordance with the embodiment of the present invention.

FIG. 6 is a flowchart of a process furnace test process which is performed by the substrate processing apparatus in accordance with an embodiment of the present invention. FIG. 7 is a schematic diagram illustrating an exemplary operation of the control unit in the process furnace test process in accordance with the embodiment of the present invention. FIG. 11 is a schematic diagram illustrating an exemplary configuration of a program for a test terminal in accordance with an embodiment of the present invention.

First, by detaching the process module controllers 91 and 92 from the LAN 80, the process module controllers 91 and 92 are separated from the comprehensive controller 91 and the first operation unit 100. Then, a test terminal 201 is connected through the LAN 81 to the process module controller 91 and, at the same time, a test terminal 202 is connected through the LAN 82 to the process module controller 92 (VS1). In addition, the first operation unit 100 is in such a state that it is connected through the LAN 80 to the comprehensive controller program 90. The LANs 80, 81 and 82 are configured by different networks through which mutual communication is impossible. Moreover, when the process module controllers 91 and 92 are separated from the comprehensive controller 90 and the first operation unit 100, it is preferable to ensure the lock (interlock) in order to prevent abrupt operations of the gate valves or various mechanisms provided at the process chambers PM1 and PM2.

In this case, each of the test terminals 201 and 202 is configured by a general-purpose computer which is provided with a CPU, a memory, a communication interface, and a hard disk. For example, a notebook computer and the like may be suitably used. As illustrated in FIG. 11, each hard disk of the test terminals 201 and 202 stores a second operation unit program 100a and a pseudo comprehensive controller program 90a. Here, the second operation unit program is, for example, a copy of a PM1 operation program (or a PM2 operation program). The second operation unit program 100a and the pseudo comprehensive controller program 90a are read from the hard disk to the memory and are executed by the CPU to implement a second operation unit 100v and a pseudo comprehensive controller 90v as a pseudo comprehensive control unit in the test terminals 201 and 202. The second operation unit 100v has the same functions (above-described functions) as those implemented in the first operation unit 100 by the comprehensive system control program and the PM1 and PM2 operation programs. Also, the pseudo comprehensive controller 90v has the same functions (above-described functions) as those of the comprehensive controller 90. That is, the second operation unit 100v and the pseudo comprehensive controller 90v almost completely simulate the first operation unit 100 and the comprehensive controller 90, respectively, and the process module controllers 91 and 92 are configured to be in such a state that they are connected to the first operation unit 100 and the comprehensive controller 90, without any modification of their program or and the like. Herein, explanation will be given on a flow of a command and its response among the second operation unit 100v, the pseudo comprehensive controller 90v, and the process module controller 91. First, a command to the process module controller 91 is transmitted from the second operation unit 100v to the process module controller 91 through the pseudo comprehensive controller 90v, and a response to the command is transmitted in a reverse manner, that is, from the process module controller 91 to the second operation unit 100v through the pseudo comprehensive controller 90v. That is, the pseudo comprehensive controller 90v manages the process module controller 91 with respect to the command and its response. Meanwhile, the second operation unit 100v communicates the command and its response with the pseudo comprehensive controller 90v, and directly communicates the others such as monitor data or downloaded data with the process module controller 91. Therefore, in addition to the second operation unit 100v, the pseudo comprehensive controller 90v is incorporated in the test terminal 201. Also, in order to enable the execution of a program used for the first operation unit 100 or a copy of the program in the test terminal 201 in such a controller configuration, as described above, the process module controller 91 and 92 are made to be a state as if they are connected to the first operation unit 100 and the comprehensive controller 90, respectively, without any modification of the program and the like.

Then, a process furnace test operation command VMI is transmitted from the second operation unit 100v of the test terminal 201 to the process module controller 91 through the pseudo comprehensive controller 90v. Also, a process test operation command VM1 is transmitted from the second operation unit 100v of the test terminal 202 to the process module controller 92 through the pseudo comprehensive controller 90v of the test terminal 202 (VS2, VS3).

That is, the process furnace test operation command VM1 instructing to start the setup process is transmitted from the second operation unit 100v of the test terminal 201 to the pseudo comprehensive controller 90v of the test terminal 201 by using the inter-process (inter-program) communication or the like (VS2). Then, the process furnace test operation command VM2 instructing to start the operation test of the process chamber PM1 is transmitted from the pseudo comprehensive controller 90v of the test terminal 201 to the process module controller 91 through the LAN 81 (VS3). Also, in the similar manner, the process furnace test operation command VM1 instructing to start the setup process is transmitted from the second operation unit 100v of the test terminal 202 to the pseudo comprehensive controller 90v of the test terminal 202 (VS2). Then, the process furnace test operation command VM2 instructing to start the operation test of the process chamber PM2 is transmitted from the pseudo comprehensive controller 90v of the test terminal 202 to the process module controller 92 through the LAN 82 (VS3).

The process module controllers 91 and 92 receiving the process furnace test operation command VM2 perform "input/output valve I/O check", "interlock check", "chamber vacuum check" and the like on the process chambers PM1 and PM2 (VS4). Various checks on the process chambers PM1 and PM2 are performed in parallel. Here, in the "input/output valve check" process, the valve button on the screen is pressed and it is checked whether the corresponding valve is actually opened or closed (whether the interconnection is correct), and it is also checked whether the opened or closed display is correct. These checks are performed as many times as a predetermined number of the valves. In the "interlock check" process, it is checked with respect to the valves whether the valve interlock operates normally or not. For example, the valve interlock previously set in the individual valves is generated, and the output of an alarm message on the screen is checked. With regard to the other hard interlock, the hard interlock is pseudo generated in the same manner as the above and then sequentially checked. The "chamber vacuum check" process is to check the leak of the chamber by creating and executing a recipe (leak check recipe) of depressurizing the chamber to a specific pressure. In the "chamber vacuum check," the assembly accuracy and the exhaust ability are checked. For example, the following processes are performed: 1. The leak check recipe is executed to depressurize the process chambers PM1 and PM2 by the pump closing the designated valve and to check the arrival pressure. 2. When the arrival pressure is OK, the valve between the pump and the chamber is closed and the process chambers PM1 and PM2 are sealed in vacuum. 3. After a designated time passes by, the leak amount is automatically calculated and it is checked whether the leak amount is OK or NG. In addition, temperature, plasma or the like, which is unique to the process chambers PM1 and PM2, is checked. Since the interlock check is related when the leak amount is NG, the "chamber vacuum check" may be considered as a kind of "interlock check" in some cases.

When those checks are completed, a process furnace test operation report VM3 is transmitted from the process module controller 91 to the second operation unit 100v of the test terminal 201 through the pseudo comprehensive controller 90v of the test terminal 201. Also, the process furnace test operation report VM3 is transmitted from the process module controller 92 to the second operation unit 100v implemented in the test terminal 202 through the pseudo comprehensive controller 90v of the test terminal 202, and the process furnace test process is finished (VS5).

That is, the process furnace test operation report VM4 is transmitted from the process module controller 91 to the pseudo comprehensive controller 90v of the test terminal 201 through the LAN 81. Then, a process furnace test operation report VMS is transmitted from the pseudo comprehensive controller 90v of the test terminal 201 to the second operation unit 100v of the test terminal 201 by using the inter-process (inter-program) communication or the like. In the similar manner, the process furnace test operation report VM4 is transmitted from the process module controller 92 to the pseudo comprehensive controller 90v of the test terminal 202 through the LAN 82. Then, the process furnace test operation report VMS is transmitted from the pseudo comprehensive controller 90v of the test terminal 202 to the second operation unit 100v of the test terminal 202 by using the inter-process (inter-program) communication or the like.

In addition, as described above, since the first operation unit 100 is in such a state that it is connected through the LAN 80 to the comprehensive controller program 90, it is preferable that, when the process furnace test processes VS1 to VS5 are performed, the test operation command is transmitted from the first operation unit 100 to the comprehensive controller 90, and valve check (open/close check of the gate valves G1 to G4), interlock check (depressurization check of the vacuum lock chambers VL1 and VL2), and chamber vacuum check (depressurization check of the vacuum carrying chamber TM, the cooling chambers CS1 and CS2, and the like) are performed in parallel.

(Carrying Test Process)

Subsequently, a carrying test process to be performed after the process furnace test process will be described with reference to FIG. 8 and FIG. 9.

Figure 8:
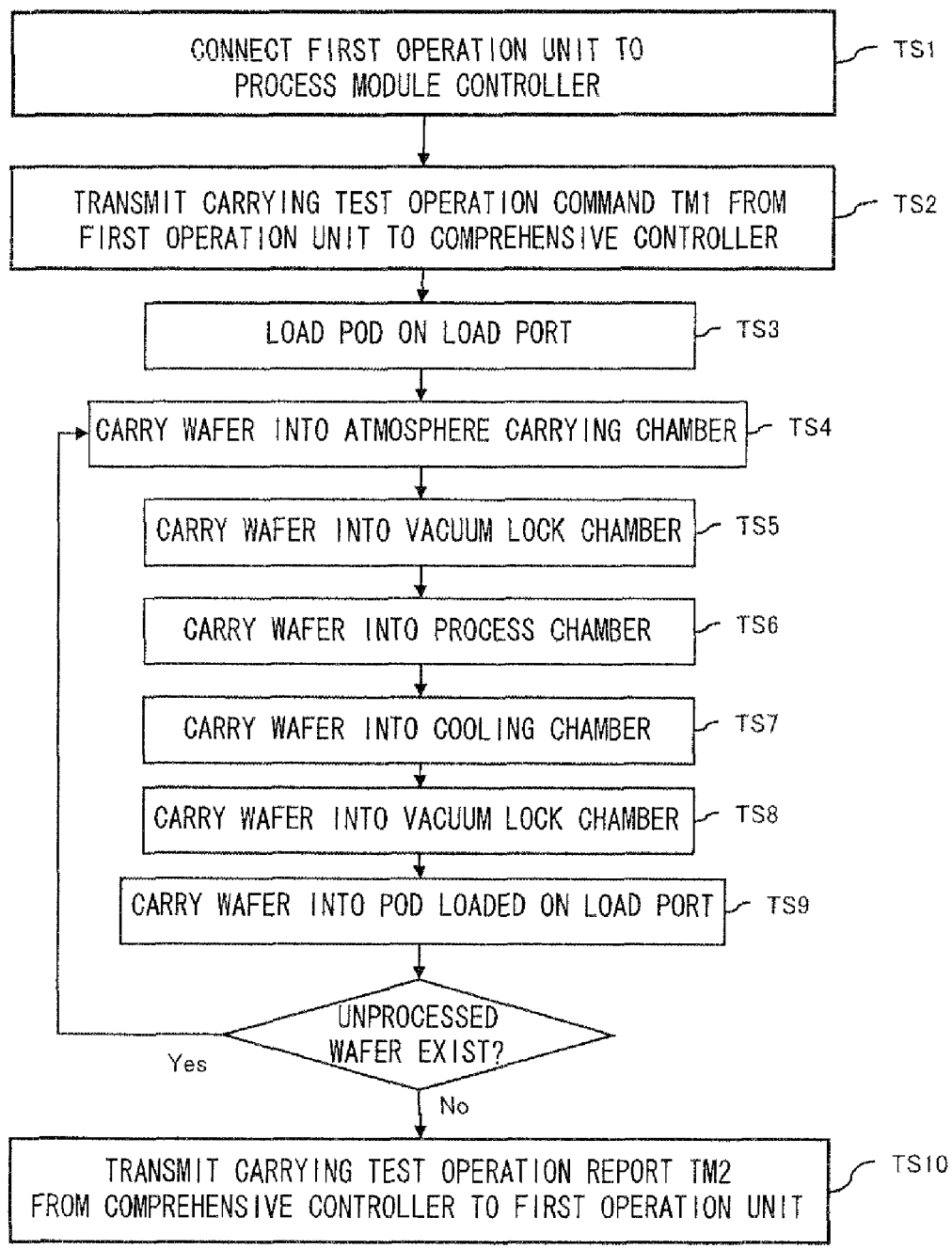
FIG. 8 is a flowchart of a carrying test process which is performed in the substrate processing apparatus in accordance with an embodiment of the present invention.
Figure 9:
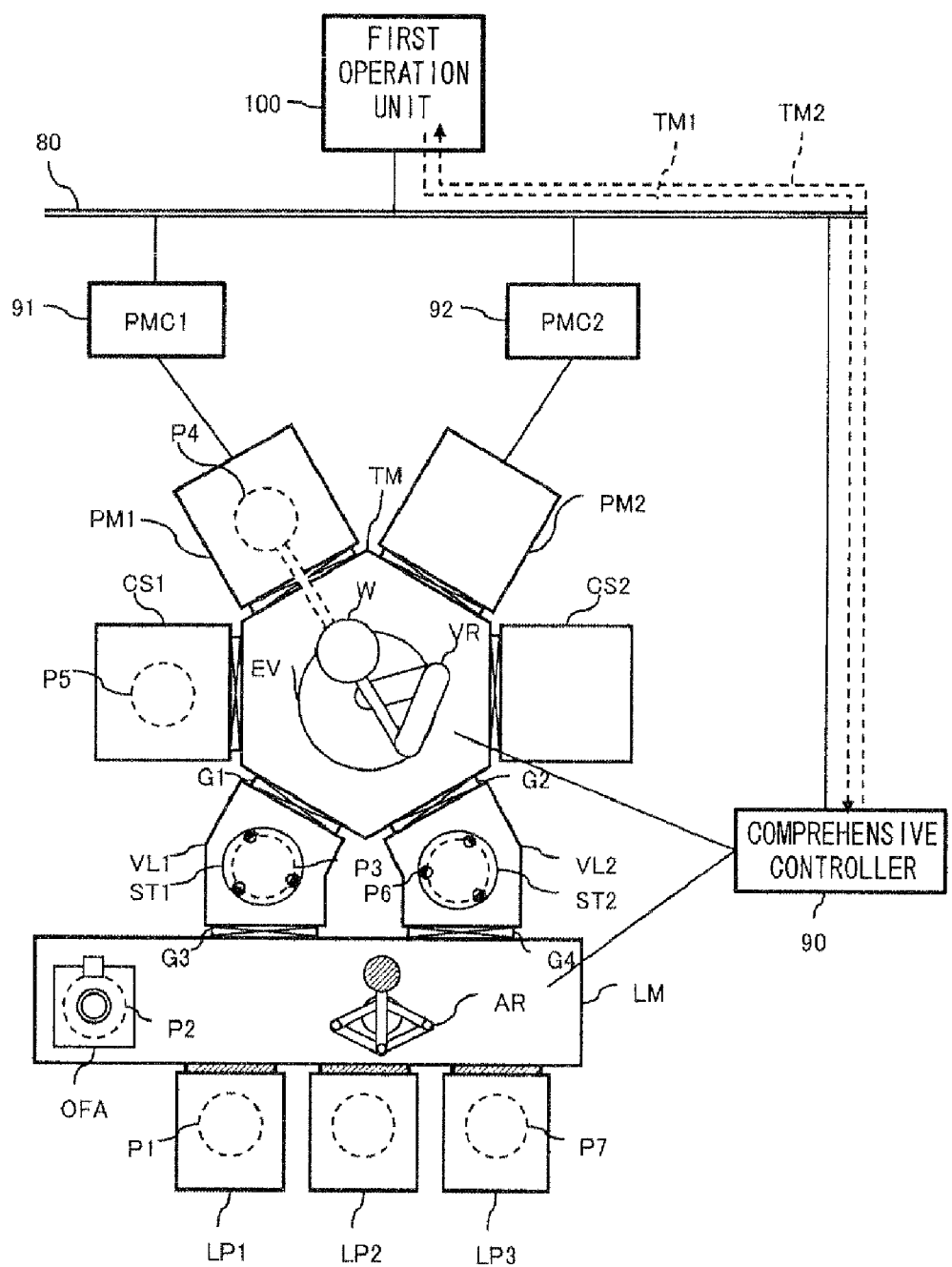
FIG. 9 is a schematic diagram illustrating an exemplary operation of the control unit in the carrying test process in accordance with the embodiment of the present invention.

FIG. 8 is a flowchart of a carrying test process which is performed in the substrate processing apparatus in accordance with an embodiment of the present invention. FIG. 9 is a schematic diagram illustrating an exemplary operation of the control unit in the carrying test process in accordance with the embodiment of the present invention.

First, by detaching the test terminals 201 and 202 from the LANs 81 and 82, the test terminals 201 and 202 are separated from the process module controllers 91 and 92, respectively. Then, by connecting the process module controllers 91 and 92 to the LAN 80, the process module controllers 91 and 92, the first operation unit 100 and the comprehensive controller 90 are connected together (TS1).

Then, a carrying test operation command TM1 instructing to start a test carrying is transmitted from the first operation unit 100 to the comprehensive controller 90 through the LAN 80 (TS2).

The comprehensive controller 90 receiving the carrying test operation command TM2 vacuum-exhausts the insides of the vacuum carrying chamber TM, the process chambers PM1 and PM2, and the cooling chambers CS1 and CS2 by closing the gate valves G1 and G4 and opening the gate valves G2 and G3. The comprehensive controller 90 supplies clean air into the atmosphere carrying chamber LM to get the atmosphere carrying chamber LM to almost the atmospheric pressure. Then, the comprehensive controller 90 loads the pod PD1 accommodating a plurality of unprocessed wafers W on the load port LP1 (TS3).

Subsequently, the comprehensive controller 90 controls the atmosphere robot AR to carry the wafer W, which is accommodated at the substrate position P1 inside the pod PD1 loaded on the load port LP1, into the atmosphere carrying chamber LM, to place the wafer W at the substrate position P2 on the orientation flat aligning device OFA, and to perform the positioning of crystal orientation (TS4).

Subsequently, the comprehensive controller 90 controls the atmosphere robot AR to pick up the wafer W placed at the substrate position P2, to carry the wafer W into the vacuum lock chamber VL1, and to place the wafer W at the substrate position P3 on the buffer stage ST1. Then, the comprehensive controller 90 closes the gate valve G3 to vacuum-exhaust the inside of the vacuum lock chamber VL1 (TS5).

When the vacuum lock chamber VL1 is depressurized up to a predetermined pressure, the comprehensive controller 90 opens the gate valve G1 while the gate valve G3 is closed. Then, the comprehensive controller 90 controls the vacuum robot VR to pick up the wafer W placed at the substrate position P3, to carry the wafer W into the process chambers PM1 and PM2, and to place the wafer W at the substrate position P4 (TS6).

When the carrying of the wafer W into the process chambers PM1 and PM2 is completed, the comprehensive controller 90 controls the vacuum robot VR to pick up the wafer W placed at the substrate position P4, to carry the wafer W into the cooling chamber CS1, and to place the wafer W at the substrate position P5 (TS7).

When the carrying of the wafer W into the cooling chamber CS1 is completed, the comprehensive controller 90 controls the vacuum robot VR to pick up the processed wafer W placed at the substrate position P5, to carry the processed wafer W into the vacuum lock chamber VL2, and place the processed wafer W at a substrate position P6 on the buffer stage ST2. Then, the comprehensive controller 90 closes the gate valve G2, supplies clean air into the vacuum lock chamber VL2 to get the vacuum lock chamber VL2 back to almost the atmospheric pressure, and opens the gate valve G4 (TS8).

Subsequently, the comprehensive controller 90 controls the atmosphere robot AR to pick up the wafer W placed at the substrate position P2, to carry the wafer W into the pod PD3 loaded on the load port LP3, and to hold the wafer W into a vacant slot (TS9).

After the above-described processes are repeated to perform automatic carrying processing on all wafers W, the comprehensive controller 90 unloads the pod PD3 accommodating the wafers W from the load port LP3. Then, the comprehensive controller 90 transmits a carrying test operation report (message) TM2 indicating the completion of the carrying test through the LAN 80 to the first operation unit 100, and finishes the carrying test process.

(Specific Embodiment)

When the setup of the process chamber PM1 is performed individually and separately, the test terminal 201 having the functions of the second operation unit 100v and the pseudo comprehensive controller 90v is prepared and connected to the process module controller 91. Then, the "input/output valve I/O check" and so on are performed through the operation of the test terminal 201. Also, the leak check recipe for depressurizing the inside of the process chamber PM1 to a specific pressure is executed. First, a specific execution command is transmitted from the second operation unit 100v through the pseudo comprehensive controller 90v to the process module controller 91. Upon reception of the execution command, the process module controller 91 requests recipe data to the second operation unit 100v. Upon reception of the request, the second operation unit 100v downloads the recipe data, which is necessary to execute the execution command, in the process module controller 91. When the download is completed, the process module controller 91 executes the process recipe by using the recipe data. In this way, the "chamber vacuum check" is performed by executing the leak check recipe. In the same manner, the first operation unit 100 and the comprehensive controller 90 are connected to the vacuum carrying chamber TM after separating the process chamber PM1 individually. At the vacuum transfer chamber TM, the leak check recipe for executing the "chamber vacuum check" is executed. First, a specific execution command is transmitted from the first operation unit 100 to the comprehensive controller 90. Upon reception of the execution command, the comprehensive controller 90 requests recipe data to the first operation unit 100. Upon reception of the request, the first operation unit 100 downloads the recipe data, which is necessary to execute the execution command, in the comprehensive controller 90. When the download is completed, the comprehensive controller 90 executes the leak check recipe by using the recipe data. The execution of the leak check recipe for the process chamber PM1 and the execution of the leak check recipe for the vacuum transfer chamber TM may be performed in parallel.

(4) Effects of the Current Embodiment

The current embodiment obtains one or more of the following effects.

(a) In the process furnace test process in accordance with the current embodiment, the test terminal 201 is connected to the process module controller 91 through the LAN 81 and the test terminal 202 is connected to the process module controller 92 through the LAN 82 (VS1). The process furnace test operation command VMI is transmitted from the second operation unit 100v of the test terminal 201 to the process module controller 91 through the pseudo comprehensive controller 90v of the test terminal 201. Also, the process furnace test operation command VMI is transmitted from the second operation unit 100v of the test terminal 202 to the process module controller 92 through the pseudo comprehensive controller 90v of the test terminal 202 (VS2, VS3). The process module controllers 91 and 92 receiving the process furnace test operation command VM2 perform "input/output valve I/O check", "interlock check", "chamber vacuum check" and the like on the process chambers PM1 and PM2 (VS4). As a result, since various checks on the process chambers PM1 and PM2 are performed in parallel, the time necessary for the setup process is reduced and therefore the operation of the substrate processing apparatus is promptly started.

FIG. 12 is a table diagram showing an example of an operation schedule of the conventional setup process. Also, FIG. 13 is a table diagram showing an example of an operation schedule of the setup process in accordance with an embodiment of the present invention. Referring to FIG. 12, since the normality check of the process chambers PM1 and PM2 is sequentially performed by using one first operation unit 100, it is difficult to reduce the setup process. On the contrary, referring to FIG. 13, since the normality check of the process chambers PM1 and PM2 (process furnace test process) is performed in parallel by using the test terminals 201 and 202, the time necessary for the setup process is reduced and therefore the operation of the substrate processing apparatus is promptly started. PF in FIG. 12 and FIG. 13 denote the transfer chamber (generic term of the vacuum carrying chamber TM and the atmosphere carrying chamber LM).

(b) In the process furnace test process in accordance with the current embodiment, the first operation unit 100 is in such a state that it is connected through the LAN 80 to the comprehensive controller program 90. Thus, when the process furnace test processes VS1 to VS5 are performed, the test operation command is transmitted from the first operation unit 100 to the comprehensive controller 90, and valve check (open/close check of the gate valves G1 to G4), interlock check (depressurization check of the vacuum lock chambers VL1 and VL2), and chamber vacuum check (depressurization check of the vacuum carrying chamber TM, the cooling chambers CS1 and CS2, and the like) are performed in parallel. As a result, as illustrated in FIG. 13, the time necessary for the setup process is further reduced and therefore the operation of the substrate processing apparatus is more promptly started. That is, the process chambers PM1 and PM2 (respective process chambers) and the vacuum carrying chambers TM (transfer chambers) are separated, and the test terminals 201 and 202 are connected to the process chambers PM1 and PM2, respectively. Since the executions of the recipes for each process chamber and each carrying chamber are performed in parallel, the time necessary for the setup process is reduced.

(c) In the setup process in accordance with the current embodiment, the programs of the process module controllers 91 and 92 are not the dedicated test programs for executing the setup process, but the actual programs performed after the start of the operation. Hence, by executing the setup process in accordance with the current embodiment, it is possible to check whether problems arise when the actual programs are executed.

Figure 10:
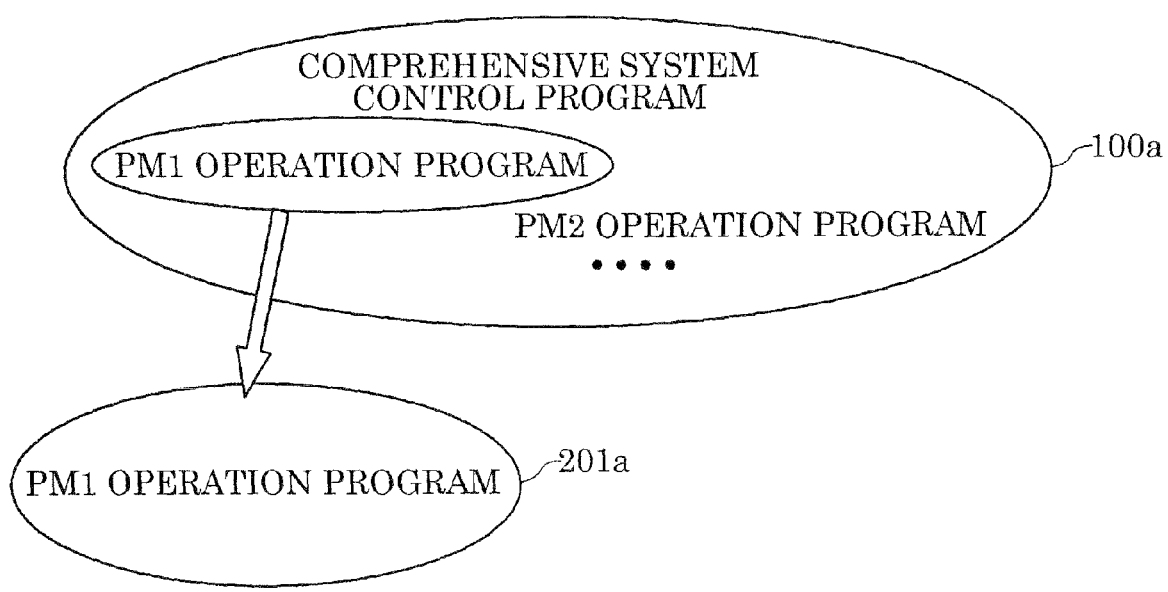
FIG. 10 is a schematic configuration diagram illustrating the extraction of a PMC operation program from a conventional operation unit program and the creation of a test program.

In addition, as described above, there may be proposed a method which installs a test program dedicated to the setup process into the process module controllers 91 and 92 and makes the process module controllers 91 and 92 execute the setup process in parallel. However, since the actual program used after the start of the operation and the test program are different, it is difficult to check whether problems arise when the actual program is executed. For example, as illustrated in FIG. 10, there may be proposed another method which separates only the PM1 operation program 201a among the programs 100a provided in the first operation unit 100, installs it into the process module controller 91, and performs the setup process by executing the PM1 operation program 201a. However, such a method has the above-described problem that cannot check the operation performed by the actual program, and also a new problem that generates a bug during the test the PM1 operation program 201a creating the PM1 operation program 201a separated alone, or causes a need to re-create the test program when the program of the first operation unit 100 is revised.

(d) In the current embodiment, the process furnace test process, the carrying test process, and the substrate processing process can be performed through modifications of the first operation unit 100, the process module controllers 91 and 92, the comprehensive controller 90, and the LAN line between the test terminals 201 and 202. That is, when the process furnace test process, the carrying test process, and the substrate processing process are performed in sequence, the time necessary for the setup process is further reduced and the operation of the substrate processing apparatus is further promptly started because the configuration of the substrate processing apparatus except the LAN line is not modified.

(e) Since the test terminals 201 and 202 are configured as a general-purpose computer which is provided with a CPU, a memory, a communication interface, and a hard disk, a notebook computer may be suitably used. Hence, in addition to the above-described setup process, the test terminals 201 and 202 may be used to acquire various data of the substrate processing apparatus, or create backup data of various setup data, or store drawing data referenced in operations, which will increase convenience of the operator. Furthermore, the setup in accordance with the current embodiment is a preparatory work before starting the operation of the substrate processing apparatus, and includes a processing preparation process after maintenance, as well as the setup when a device is loaded.

<Another Exemplary Embodiment of the Present Invention>

Figure 2:
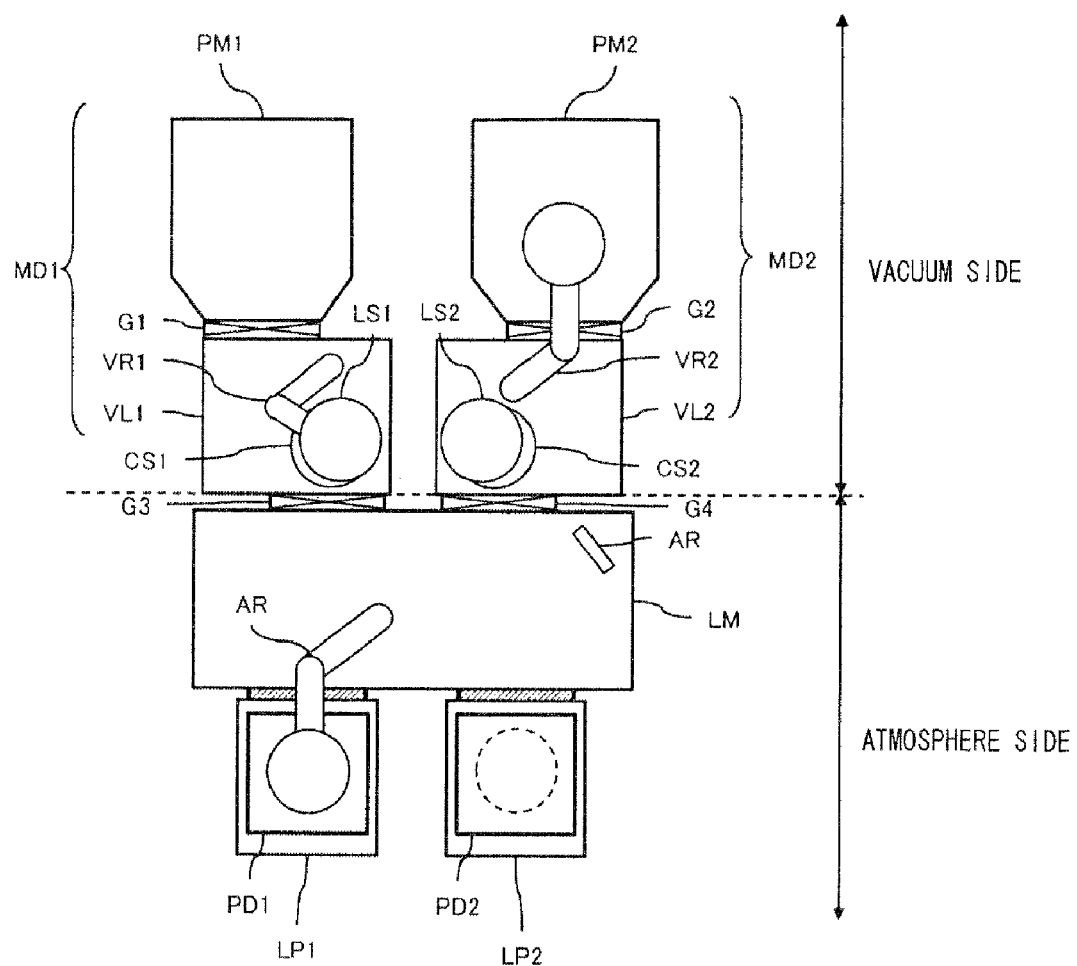
FIG. 2 is a schematic configuration diagram of an in-line type substrate processing apparatus in accordance with another embodiment of the present invention.

Subsequently, the configuration of the substrate processing apparatus in accordance with another embodiment of the present invention is illustrated in FIG. 2. FIG. 2 is a schematic configuration diagram of an in-line type substrate processing apparatus in accordance with another embodiment of the present invention. The in-line type substrate processing apparatus is also divided into a vacuum side and an atmosphere side.

(Configuration of Vacuum Side)

On the vacuum side of the in-line type substrate processing apparatus, two substrate process modules MD1 and MD2 are installed in parallel. The substrate process module MD1 is provided with a process chamber PM1 as a process having a processing chamber which processes a substrate such as a wafer W, and a vacuum lock chamber VL1 as a preliminary chamber installed in a front stage. Like the substrate process module MD1, the substrate process module MD2 is provided with a process chamber PM2 and a vacuum lock chamber VL2.

Like the case of the cluster type substrate processing apparatus, the process chambers PM1 and PM2 are configured to give an added value to the wafer W, for example, by performing a process of forming a thin film on the wafer W by a CVD method or a PVD method, a process of forming an oxide film or a nitride film on the surface of the wafer W, or a process of forming a metal thin film on the wafer W. The process chambers PM1 and PM2 are provided with a gas introduction/exhaust mechanism, a temperature control/plasma discharge mechanism, MFCs 11 which control a flow rate of a process gas supplied into the process chambers PM1 and PM2, automatic pressure controllers (APC) 12 which control pressure inside the process chambers PM1 and PM2, temperature regulators 13 which control temperature inside the process chambers PM1 and PM2, and input/output valve I/Os 14 which control on/off of a process gas supply or exhaust. While exhausting the insides of the process chambers PM1 and PM2 by the gas exhaust mechanism and supplying the process gas into the process chambers PM1 and PM2 by the gas introduction mechanism at the same time, high-frequency power is supplied to the process chambers PM1 and PM2 to generate plasma inside the process chambers PM1 and PM2, and the surface of the wafer W is processed.

The vacuum lock chambers VL1 and VL2 function as preliminary chambers which load the wafer W into the process chambers PM1 and PM2, or as preliminary chambers which unload the wafer W from the process chambers PM1 and PM2.

At the vacuum lock chambers VL1 and VL2, vacuum robots VR1 and VR2 are installed as a vacuum carrying mechanism. The vacuum robots VR1 and VR2 can carry the wafer W between the process chamber PM1 and vacuum lock chamber VL1 and between the process chamber PM2 and the vacuum lock chamber VL2. The vacuum robots VR1 and VR2 are provided with an arm as a substrate loading unit.

In addition, the vacuum lock chambers VL1 and VL2 are provided with a multi-stepped stage which can hold the wafer W, for example, an upper/lower two-stepped stage. Upper-stepped buffer stages LS1 and LS2 are provided with a mechanism which holds the wafer W, and lower-stepped cooling stages CS1 and CS2 are provided with a mechanism which cools the wafer W.

The vacuum lock chambers VL1 and VL2 are configured to communicate with the process chambers PM1 and PM2, respectively, and also configured to communicate with an atmosphere carrying chamber LM (which will be described later) through gate valves G3 and G4, respectively. Accordingly, by opening the gate valves G1 and G2 with the gate valves G3 and G4 closed, the wafer W can be carried between the vacuum lock chamber VL1 and the process chamber PM1 and between the vacuum lock chamber VL2 and the process chamber PM2 while the inside of the process chambers PM1 and PM2 are kept in a vacuum-tight state.

Moreover, the vacuum lock chambers VL1 and VL2 are configured in a load lock chamber structure which can withstand a negative pressure such as a vacuum state lower than atmospheric pressure, and configured so that their insides can be vacuum-exhausted. Accordingly, by closing the gate valves G1 and G2 to supply clean air into the vacuum lock chambers VL1 and VL2 and then opening the gate valves G3 and G4, the wafer W can be carried between the vacuum lock chambers VL1 and VL2 and the atmosphere carrying chamber LM.

(Configuration of Atmosphere Side)

As described above, the atmosphere side of the in-line type substrate processing apparatus is provided with the atmosphere carrying chamber LM connected to the vacuum lock chambers VL1 and VL2, and load ports LP1 and LP2 as a substrate accommodating unit which loads the substrate accommodating containers (hereinafter, referred to as pods PD1 and PD2) connected to the atmosphere carrying chamber LM.

At the atmosphere carrying chamber LM, an atmosphere robot AR is installed so that the wafer W can be carried between the vacuum lock chambers VL1 and VL2 and the load ports LP1 and LP2. In addition, the atmosphere robot AR is provided with an arm as a substrate loading unit.

Moreover, the atmosphere carrying chamber LM is provide with an aligner unit AU as a substrate position correcting device which corrects a deviation of the wafer W at the time of carrying the wafer W and perform notch-alignment to align the notch of the wafer W in a certain direction.

The load ports LP1 and LP2 can load the pods PD1 and PD2 which accommodate a plurality of wafers W, respectively.

(Configuration of the Others)

Since the configuration of the others including the control unit, the substrate processing process, the process furnace test process, and the carrying test process are substantially identical to the above-described embodiments, their duplicate description will be omitted.

<Another Exemplary Embodiment>

While it has been described above that the wafer W is individually carried into the process chambers PM1 and PM2 by the atmosphere robot AR and the vacuum robot VR as the carrying mechanism, the present invention is not limited to such a configuration. For example, a boat as a substrate holder which holds a plurality of wafers W at a horizontal position in a multiple stage may be carried into the insides of the process chambers PM1 and PM2. Then, the process chambers PM1 and PM2 are regulated to a certain temperature and a certain pressure, a substrate held by the boat is processed by supplying a process gas into the process chamber. The boat holding the processed wafer is carried out of the process chamber. In this way, the wafer W is processed. Furthermore, explanation have been given on the embodiment in which the setup of the process chambers PM1 and PM2 (process chambers) and the vacuum carrying chambers TM (carrying chambers) is performed in parallel by using several test terminals 201 and 202, or the embodiment in which the setup of the process chambers PM1 and PM2 (process chambers) and the vacuum lock chambers VL (carrying chambers) is performed in parallel, but the present invention is not limited to those embodiments. For example, only one test terminal may be installed, and programs for a plurality of process chambers may be executed at the same time. In addition, it is preferable that the first operation unit 100 is configured to have the function of the pseudo comprehensive controller 90v. In this case, a predetermined number of test terminals may be connected, and the test terminals having the same function as the first operation unit having the function of the pseudo comprehensive controller 90v may be installed through a simple method such as a download or a copy. Furthermore, the separation work of the process chambers and the like may be executed, and the parallel setup work may be executed by the test terminal. Moreover, when the process chambers and so on are separated and executed in parallel, without using the test terminals, it is necessary to execute the programs for the process chambers or the carrying chambers at the same time. For example, it is necessary to execute a plurality of CPUs individually in order that programs are executed at the same time with respect to a plurality of process chambers or one or more process chambers and carrying chambers.

While the semiconductor manufacturing apparatus has been described above as one example of the substrate processing apparatus, the present invention is not limited to the semiconductor manufacturing apparatus, but may include an apparatus for processing a glass substrate such as an LCD device. Any detailed contents of the substrate processing are available, and a film-forming process, an annealing process, an oxidation process, a nitridation process, and a diffusion process may also be available. Furthermore, the film-forming process may include a CVD, a PVD, a process of forming an oxide film and a nitride film, and a process of forming a metal-containing film.

<Preferred Embodiment of the Present Invention>

Hereinafter, preferred embodiments of the present invention will be complementarily described.

In a first embodiment of the present invention, there is provided a setup method of a substrate processing apparatus, a plurality of process furnaces each including a process chamber which processes a substrate; a plurality of process furnace control units connected to the plurality of process furnaces to individually control operations of the plurality of process furnaces, respectively; a comprehensive control unit configured to be connectable to the plurality of process furnace control units to comprehensively control the operations of the plurality of process furnaces through the plurality of process furnace control units, respectively; and a first operation unit configured to be connectable to the comprehensive control unit and the plurality of process furnace control units to transmit an operation command to the plurality of process furnace control units through the comprehensive control unit and to receive an operation report from the plurality of process furnace control units through the comprehensive control unit. The setup method of a substrate processing apparatus comprises a process furnace test process which comprises: connecting a test terminal, which includes a pseudo comprehensive control unit and a second operation unit, to the plurality of process furnace control units, with the plurality of process furnace control units being separated from the comprehensive control unit and the first operation unit; transmitting a process furnace test operation command from the second operation unit to the plurality of process furnace control units through the pseudo comprehensive control unit; testing the operations of the plurality of process furnaces in parallel by the plurality of process furnace control units receiving the process furnace test operation command; and transmitting a process furnace test operation report from the plurality of process furnace control units to the second operation unit through the pseudo comprehensive control unit.

In a second embodiment of the present invention, there is provided the setup method of a substrate processing apparatus in accordance with the first embodiment, further including: a carrying chamber connected to communicate with the plurality of process chambers; and a carrying mechanism configured to carry a substrate between the process chamber and the carrying chamber, wherein the comprehensive control unit is connected to the carrying mechanism to control a carrying operation of the carrying mechanism. The setup method of a substrate processing apparatus in accordance with the second embodiment of the present invention further comprises a carrying test process which comprises: after the process furnace test process, connecting the first operation unit to the comprehensive control unit and the plurality of process furnace control units, with the test terminal being separated from the plurality of process furnace control units; transmitting a carrying test operation command from the first operation unit to the comprehensive control unit; communicating the process chamber with the carrying chamber and testing an operation of the carrying mechanism by the comprehensive control unit receiving the carrying test operation command; and transmitting a carrying test operation report from the comprehensive control unit to the first operation unit.

In a third embodiment of the present invention, there is provided the method for manufacturing the semiconductor device in accordance with the first or second embodiment, which is performed by the substrate processing apparatus, the method further comprising a substrate processing process which comprises supplying a process gas into the process chamber where the substrate is carried, and generating plasma in the inside of the process chamber by using high-frequency power, whereby the surface of the substrate is processed.

In a fourth embodiment of the present invention, there is provided the method for manufacturing the semiconductor device in accordance with the first or second embodiment, which is performed by the substrate processing apparatus, the method further comprising: carrying a substrate holder holding a plurality of substrates at a horizontal position in a multiple stage into the process chamber; regulating the inside of the process chamber to a certain temperature and a certain pressure; processing the substrates by supplying the process gas into the process chamber; and carrying the substrate holder holding the processed substrates out of the process chamber.

In a fifth embodiment of the present invention, there is provided a setup method, which is performed by a cluster type substrate processing apparatus including: a plurality of process furnaces each including a process chamber which processes a substrate; a vacuum carrying chamber connected to communicate with the plurality of process chambers; a depressurizable preliminary chamber connected to communicate with the vacuum carrying chamber; an atmosphere carrying chamber connected to communicate with the preliminary chamber and into which the substrate is carried in an atmospheric pressure state; a substrate accommodating unit connected to communicate with the atmosphere carrying chamber to accommodate a plurality of substrates; a vacuum carrying mechanism installed inside the vacuum carrying chamber to carry the substrate between the process chamber and the preliminary chamber; an atmosphere carrying mechanism installed inside the atmosphere carrying chamber to carry the substrate between the preliminary chamber and the substrate accommodating unit; a plurality of process furnace control units connected to the plurality of process furnaces to individually control operations of the process furnaces, respectively; a comprehensive control unit configured to be connectable to the plurality of process furnace control units to comprehensively control the operations of the plurality of process furnaces through the plurality of process furnace control units, and connected to the vacuum carrying mechanism and the atmosphere carrying mechanism to control carrying operations of the vacuum carrying mechanism and the atmosphere carrying mechanism, respectively; and a first operation unit configured to be connectable to the comprehensive control unit and the plurality of process furnace control units to transmit an operation command to the plurality of process furnace control units through the comprehensive control unit and to receive an operation report from the plurality of process furnace control units through the comprehensive control unit. The method for manufacturing the semiconductor device in accordance with the fifth embodiment comprises a process furnace test process, which comprises: connecting a test terminal, which includes a pseudo comprehensive control unit and a second operation unit, to the plurality of process furnace control units, with the plurality of process furnace control units being separated from the comprehensive control unit and the first operation unit; transmitting a process furnace test operation command from the second operation unit to the plurality of process furnace control units through the pseudo comprehensive control unit; testing the operations of the plurality of process furnaces in parallel by the plurality of process furnace control units receiving the process furnace test operation command; and transmitting a process furnace operation report from the plurality of process furnace control units to the second operation unit through the pseudo comprehensive control unit.

In a sixth embodiment, there is provided a setup method, which is performed by an in-line type substrate processing apparatus including: an atmosphere carrying chamber; a plurality of depressurizable preliminary chambers connected in parallel to communicate with one side of the atmosphere carrying chamber; a plurality of process furnaces each connected to communicate with the preliminary chambers and including a process chamber which processes a substrate; a substrate accommodating unit connected in parallel to communicate with the other side of the atmosphere carrying chamber to hold a substrate accommodating container which accommodates a plurality of substrates; a vacuum carrying mechanism installed inside the preliminary chamber to carry the substrate between the process chamber and the preliminary chamber; an atmosphere carrying mechanism installed inside the atmosphere carrying chamber to carry the substrate between the preliminary chamber and the substrate accommodating unit; a plurality of process furnace control units connected to the plurality of process furnaces to individually control operations of the process furnaces, respectively; a comprehensive control unit configured to be connectable to the plurality of process furnace control units to comprehensively control the operations of the plurality of process furnaces through the plurality of process furnace control units, and connected to the vacuum carrying mechanism and the atmosphere carrying mechanism to control carrying operations of the vacuum carrying mechanism and the atmosphere carrying mechanism, respectively; and a first operation unit configured to be connectable to the comprehensive control unit and the plurality of process furnace control units to transmit an operation command to the plurality of process furnace control units through the comprehensive control unit and to receive an operation report from the plurality of process furnace control units through the comprehensive control unit. The setup method of the substrate processing apparatus in accordance with the sixth embodiment comprises a process furnace test process, which comprises: connecting a test terminal, which includes a pseudo comprehensive control unit and a second operation unit, to the plurality of process furnace control units, with the plurality of process furnace control units being separated from the comprehensive control unit and the first operation unit; transmitting a process furnace test operation command from the second operation unit to the plurality of process furnace control units through the pseudo comprehensive control unit; testing the operations of the plurality of process furnaces in parallel by the plurality of process furnace control units receiving the process furnace test operation command; and transmitting a process furnace operation report from the plurality of process furnace control units to the second operation unit through the pseudo comprehensive control unit.

In a seventh embodiment, the method for manufacturing the semiconductor device in accordance with any one of the first to sixth embodiments, which is performed by the substrate processing apparatus, further comprises a process of supplying a process gas into the process chamber where the substrate is carried, and forming a thin film on a substrate by a CVD method or a PVD method, or a process of forming an oxide film or a nitride film on the surface of the substrate, or a process of forming a metal thin film on the substrate of the substrate.

What is claimed is:

1. A setup method of a substrate processing apparatus, the substrate processing apparatus comprising: a plurality of process chambers configured to process substrates; a plurality of process chamber control units connected to the plurality of process chambers to individually control operations of the plurality of process chambers; a comprehensive control unit configured to be connectable to the plurality of process chamber control units to comprehensively control the operations of the plurality of process chambers through the plurality of process chamber control units; and a first operation unit configured to be connectable to the comprehensive control unit and the plurality of process chamber control units to transmit an operation command to the plurality of process chamber control units through the comprehensive control unit and to receive an operation report from the plurality of process chamber control units through the comprehensive control unit, the setup method comprising a process chamber test process comprising:

connecting a test terminal including a pseudo comprehensive control unit and a second operation unit to the plurality of process chamber control units with the plurality of process chamber control units being separated from the comprehensive control unit and the first operation unit;

transmitting a process chamber test operation command from the second operation unit to the plurality of process chamber control units through the pseudo comprehensive control unit;

testing the operations of the plurality of process chambers in parallel by the plurality of process chamber control units receiving the process chamber test operation command; and transmitting process chamber test operation reports from the plurality of process chamber control units to the second operation unit through the pseudo comprehensive control unit.

2. The setup method according to claim 1, wherein the substrate processing apparatus further comprises:

a carrying chamber connected to communicate with the plurality of process chambers; and a carrying mechanism configured to carry the substrates between the plurality of process chambers and the carrying chamber, wherein the comprehensive control unit is connected to the carrying mechanism to control a carrying operation of the carrying mechanism, and wherein the setup method further comprises a carrying test process after the process chamber test process, the carrying test process comprising:

connecting the first operation unit to the comprehensive control unit and the plurality of process chamber control units with the test terminal being separated from the plurality of process chamber control units;

transmitting a carrying test operation command from the first operation unit to the comprehensive control unit;

communicating the plurality of process chambers with the carrying chamber, and testing the carrvina operation of the carrying mechanism by the comprehensive control unit receiving the carrying test operation command; and transmitting a carrying test operation report from the comprehensive control unit to the first operation unit.

3. The setup method according to claim 2, comprising:
at least one of an I/O check process, wherein an operation check of input/output valves provided in the substrate processing apparatus is performed,
wherein a depressurization operation check of interiors provided in the substrate processing apparatus is performed, and a
wherein the carrying operation check of the carrying mechanism provided in the substrate processing apparatus is performed.

4. The setup method according to claim 2, wherein the carrying operation of the carrying mechanism and the operations of the plurality of process chambers are performed in parallel.

5. The setup method according to claim 1, further comprising:
connecting a plurality of test terminals to the plurality of process chamber control units.

6. The setup method according to any one of claims 1-3, 4, and 5, wherein the substrate processing apparatus is one of a cluster type and an in-line type.

7. A method of manufacturing a semiconductor device, the method comprising:
a setup process of a substrate processing apparatus and a substrate processing process using the substrate processing apparatus, the substrate processing apparatus comprising:
a plurality of process chambers configured to process substrates; a plurality of process chamber control units connected to the plurality of process chambers to individually control operations of the plurality of process chambers;
a comprehensive control unit configured to be connectable to the plurality of process chamber control units to comprehensively control the operations of the plurality of process chambers through the plurality of process chamber control units; and
a first operation unit configured to be connectable to the comprehensive control unit and the plurality of process chamber control units to transmit an operation command to the plurality of process chamber control units through the comprehensive control unit and to receive an operation report from the plurality of process chamber control units through the comprehensive control unit, the setup process including a process chamber test process comprising:
connecting a test terminal including a pseudo comprehensive control unit and a second operation unit to the plurality of process chamber control units with the plurality of process chamber control units being separated from the comprehensive control unit and the first operation unit;
transmitting a process chamber test operation command from the second operation unit to the plurality of process chamber control units through the pseudo comprehensive control unit;

testing the operations of the plurality of process chambers in parallel by the plurality of process chamber control units receiving the process chamber test operation command; and transmitting process chamber test operation reports from the plurality of process chamber control units to the second operation unit through the pseudo comprehensive control unit.

8. The method according to claim 7,
wherein the substrate processing apparatus further comprises: a carrying chamber connected to communicate with the plurality of process chambers; and a carrying mechanism configured to carry the substrates between the plurality of process chambers and the carrying chamber, wherein the comprehensive control unit is connected to the carrying mechanism to control a carrying operation of the carrying mechanism, and
wherein the setup process further comprises a carrying test process performed after the process chamber test process, the carrying test process comprising:
connecting the first operation unit to the comprehensive control unit and the plurality of process chamber control units with the test terminal being separated from the plurality of process chamber control units;
transmitting a carrying test operation command from the first operation unit to the comprehensive control unit;
communicating the plurality of process chambers with the carrying chamber, and testing the carrying operation of the carrying mechanism by the comprehensive control unit receiving the carrying test operation command; and
transmitting a carrying test operation report from the comprehensive control unit to the first operation unit.

9. The method according to claim 7, further comprising:
connecting a plurality of the test terminal to the plurality of process chamber control units.

10. The method according to claim 8,
wherein the setup process comprises at least one of an I/O check process,
wherein an operation check of input/output valves provided in the substrate processing apparatus is performed,
wherein a depressurization operation check of interiors provided in the substrate processing apparatus is performed, and
wherein the carrying operation check of the carrying mechanism provided in the substrate processing apparatus is performed.

11. The method according to claim 8, wherein the carrying operation of the carrying mechanism and the operations of the plurality of process chambers are performed in parallel.

12. The method according to claim 7, wherein the substrate processing process comprises:
supplying a process gas into the process chamber with the substrates accommodated therein; and
generating plasma in an inside of the process chamber using a high-frequency power to process surfaces of the substrates.

13. The method according to claim 7, wherein the substrate processing process comprises:
supplying a process gas into the process chamber with the substrates accommodated therein to form a thin film on the substrates, an oxide film or a nitride film on surfaces of the substrates, or a metal thin film on the substrates.

14. The method according to claim 7, wherein the substrate processing process comprises:
loading the substrates held horizontally by a substrate holder in multiple stages into the process chamber;

adjusting an inside temperature and an inside pressure of the process chamber;

supplying a process gas into the process chamber to process the substrates; and unloading the substrates held by the substrate holder out of the process chamber.

* * * * *